Aug. 25, 1964 M. F. SCHMICH Re. 25,633
PROCESS FOR MAKING FUSED JUNCTION SEMICONDUCTOR DEVICES
Original Filed Sept. 29, 1954
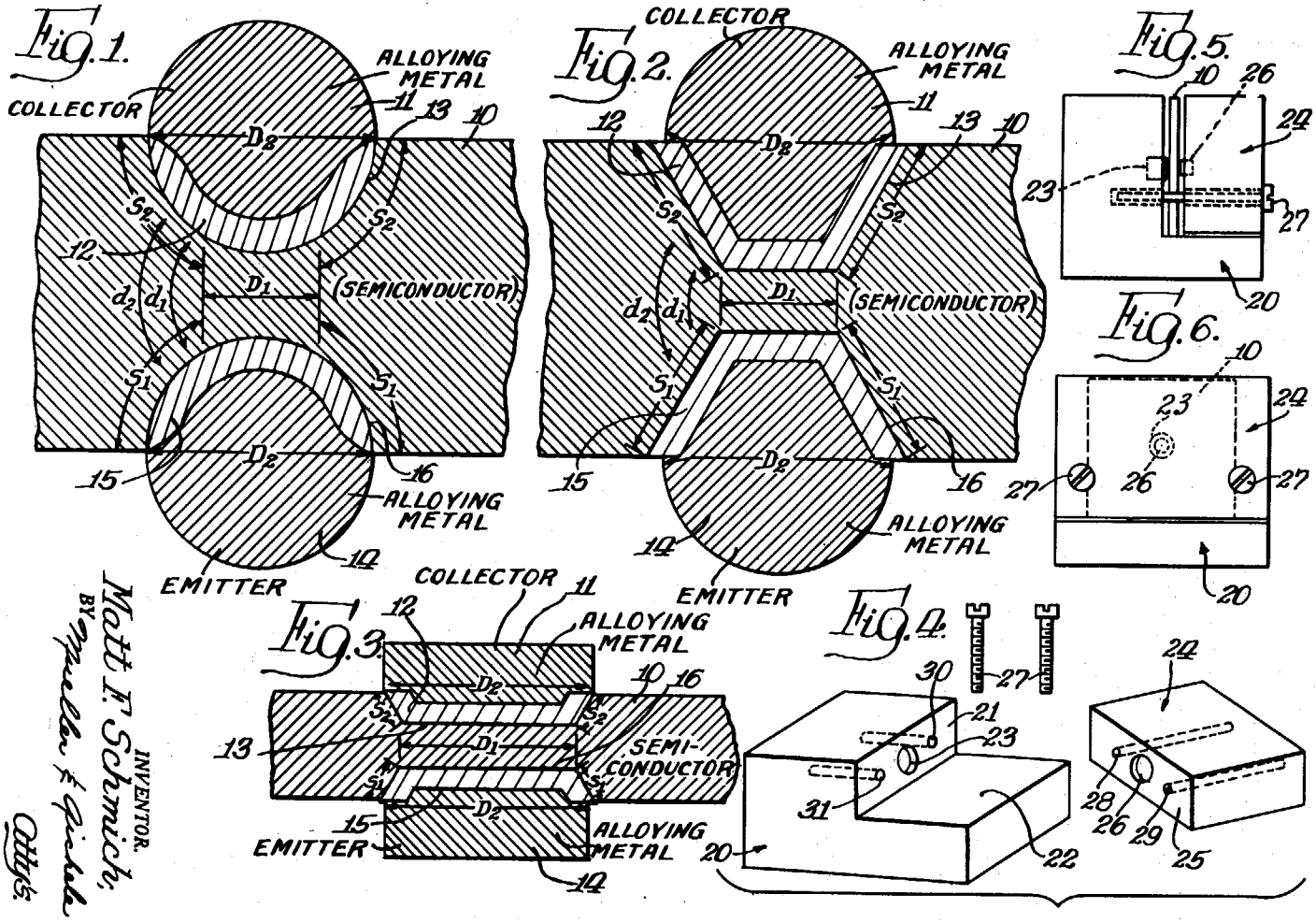
INVENTOR.
Matt F. Schmich,
BY Mueller & Aichele
Attys.

United States Patent Office

Re. 25,633
Reissued Aug. 25, 1964

25,633

PROCESS FOR MAKING FUSED JUNCTION SEMICONDUCTOR DEVICES

Matt F. Schmich, Scottsdale, Ariz., assignor to Motorola, Inc., Chicago, Ill., a corporation of Illinois Original No. 2,850,413, dated Sept. 2, 1958, Ser. No. 459,045, Sept. 29, 1954. Application for reissue May 16, 1962, Ser. No. 197,223
4 Claims. (Cl. 148—179)

Matter enclosed in heavy brackets [ ] appears in the original patent but forms no part of this reissue specification; matter printed in italics indicates the additions made by reissue.

The present invention relates to alloyed-junction semiconductor assemblies and more particularly to an improved method and apparatus for fabricating high power alloyed-junction semiconductor units such as diodes, transistors and the like.

The alloyed-junction transistor is known and it comprises a crystal wafer of semiconductor material of one conductivity type having electrodes of a selected alloying metal fused to the opposite sides thereof. The areas of the crystal wafer adjacent the respective electrodes contain traces of the alloying metal, and the alloying metal is chosen so that these areas are of the opposite conductivity type to that of the crystal wafer itself, so that p–n junctions are formed between these areas and the base region of the crystal wafer. It is usual in present-day transistors of this type that the semiconductor crystal wafer be composed of n-type germanium, and that indium be used as the alloying metal. Indium is preferred since it alloys with the germanium at relatively low temperatures and when it solidifies, it does not set up any appreciable stresses in the crystal. However, the alloyed-junction transistor can be made of any suitable semiconductor material, such as germanium or silicon of the n-type or of the p-type; and any suitable material can be used for the alloying electrodes that is capable of imparting characteristics to the areas referred to above that are of the opposite conductivity type with respect to the base region of the semiconductor crystal that is utilized in the assembly.

The power handling capabilities of units of this type are limited by excessive internal heating and excessive distortion of the signals translated thereby at relatively high power. Therefore, to provide a high power unit of this type, it is necessary to provide some means for preventing excessive internal heating and distortion in the power range in which the unit is to be operated. The internal heating of the unit can be greatly decreased by filling the container in which the unit is mounted with a cooling liquid; and by other expedients known to the art, such as using a ribbon connection to the collector electrode to provide a relatively large heat dissipating surface and by connecting the container to a heat sink which conducts away the heat of the cooling liquid. This construction causes the heat at the junction within the semiconductor crystal to be rapidly conducted away and enables the unit to be operated at relatively high power without excessive internal heating.

Distortion often occurs in a transistor unit due to the change in current gain as the emitter current is varied. This distortion is especially pronounced in power transistors since it increases as the current density at the junctions increases. It is believed that this distortion is caused by changes in the characteristics of the base material produced by the injected carriers, and these changes with the resulting distortion become more pronounced as the current density at the emitter junction is increased. Therefore, it is desirable to maintain the current density at the junctions as low as possible in high power transistors both from a distortion standpoint and also from an internal heating standpoint.

It is essential, therefore, to provide relatively large area junctions in high power alloyed-junction transistors so as to reduce the current density thereas as much as possible. The provision of such large area junctions in an alloyed-junction semiconductor assembly, however, has proven difficult when the usual production techniques are followed. This is because the molten alloying material tends to assume the shape of a sphere at the fusion temperature, the flow of the metal being limited by the surface tension thereof. Thus, it is difficult to make the alloying material cover a relatively large area of the semiconductor crystal wafer during fusion to provide the desired large area junction. The surface tension decreases as the temperature is increased, so that increase of temperature causes the molten alloying material to wet and cover a larger area of the semiconductor. However, this temperature increase also increases the solubility of the semiconductor in the alloying metal and causes deeper penetration of the alloying metal in the semiconductor crystal. Moreover, the use of more alloying metal to cover the desired area at lower temperatures also causes deeper penetration, because penetration is also dependent upon the thickness of the alloying material. This deep penetration of the alloying metal adversely affects the geometry of the junctions, and decreases the effective area of the junctions as will be described. It is, therefore, essential for high power fused junction semiconductor assemblies that the fabricating process will provide relatively large area junctions but relatively small penetration of the alloying material.

It is, accordingly, an object of the present invention to provide an improved process and apparatus for fabricating semiconductor assemblies of the alloyed-junction type that are suitable for relatively high power operation.

Another object of the invention is to provide an improved process and apparatus for fabricating alloyed-junction transistors that are capable of relatively high power operation with relatively low internal heating and substantially no distortion of the signals translated thereby.

Yet another object of the invention is to provide an improved process and apparatus for fabricating semiconductor assemblies of the alloyed-junction type having at least one relatively large area junction but with relatively low penetration of the alloying material.

A feature of the invention is the provision of the method and apparatus whereby the lateral flow and thickness of the molten alloying metal is controlled during fusion thereof to the semiconductor crystal wafer so that the molten metal is constrained to cover a selected area of the crystal and so that its tendency to assume a spherical shape is overcome. The penetration of the molten metal into the crystal wafer is then controlled by controlling the temperature of the molten metal.

The above and other features of the invention which are believed to be new are set forth with particularly in the appended claims. The invention itself, however, together with further objects and advantages thereof may best be understood by reference to the accompanying drawing, in which:

FIGS. 1–3 are cross-sectional schematic views of different alloyed-junction transistors, and are useful in explaining the invention; and FIGS. 4–6 are various views of an assembly jig constructed in accordance with the invention and which may be utilized in carrying out the process of the invention.

The invention provides a method for fabricating a semiconductor assembly which includes the following steps:

(1) Providing a body of a semiconductor material, (2) Positioning a pellet of an alloying material on the body.

(3) Heating the pellet to a molten state, (4) Controlling the lateral flow and the thickness of the molten alloying material so that it covers a selected area of the body and so that its tendency to assume a spherical shape is overcome, and (5) Controlling the temperature of the molten alloying material to provide a selected penetration thereof into the semiconductor body.

The invention also provides an assembly jig for use in the process set forth above, and which jig includes a first block of a heat resistant material having a cutout section which forms a shoulder and a shelf portion, the first block having a cavity formed in its shoulder portion. The jig also includes a second block of heat resistant material adapted to fit over the shelf portion of the first block and having a surface adapted to face the shoulder portion of the first block. The second block has a cavity formed in the surface thereof, mentioned above, and the cavities in the first and second blocks are positioned to be aligned with one another when the second block is fitted over the shelf portion of the first block. Finally, the jig includes means for holding the blocks together with the second block fitted over the shelf portion of the first block and with the surface referred to above of the second block facing the shoulder portion of the first block.

As stated previously herein, excessive penetration of the alloying material into the semiconductor crystal wafer results in unfavorable geometry in the junctions. Such excessive penetration is shown in the assemblies of FIGS. 1 and 2. FIG. 1 is a cross-sectional view of a semiconductor crystal wafer 10 having a collector electrode 11 of alloying material fused to one of its faces with a recrystallized area 12 within the wafer adjacent the electrode. The recrystallized area forms a p-n junction 13 with the base region of the semiconductor crystal wafer 10. The crystal wafer also has an emitter electrode 14 fused to its opposite face directly opposite collector electrode 11. A recrystallized area 15 is formed within the crystal wafer adjacent the emitter electrode 14 and this latter recrystallized area forms a second p-n junction 16 with the base region of the crystal wafer.

As shown in FIG. 1, the junctions 13 and 16 have large portions $S_2$ and $S_1$ of their areas that are ineffective in the operation of the transistor, the effective areas of the junctions being given by the diameter $D_1$, that is, those areas which are essentially in spaced parallel relation with one another. Thus, even though the actual areas of the semiconductor wafer covered by the electrodes 11 and 14 may be relatively large, the effective areas of the junctions are relatively small which results in high current density for high power operation with resulting high internal heating and distortion. In addition, the ineffective areas of the junction tend to reduce the frequency response by transit time dispersion resulting from variations in the path lengths between the junctions, as for example, $d_1$ and $d_2$ in FIG. 1.

FIG. 2 shows a transistor unit in which the electrodes 11 and 14 are fused onto the (111) Miller Indices planes of the semiconductor crystal 10 in accordance with the teachings of copending application Serial No. 409,339, filed February 10, 1954, in the name of William E. Taylor *which issued February 14, 1961, as Patent No. 2,971,869.* As shown in the latter figure, somewhat more favorable geometry may be obtained, but in either case the effective areas of the junctions (given by the diameter $D_1$) is substantially smaller than the areas which intersect the surface of the crystal wafer (given by the diameter $D_2$). There will also be large areas $S_1$ and $S_2$ of the emitter and collector junctions in the latter unit which are relatively ineffective and which contribute to dispersion.

The arrangement of FIG. 3 shows the effect on the geometries of the junctions when relatively shallow penetration is used. As shown in this latter figure, the effective area $D_1$ of each junction is materially increased, and the ineffective areas $S_1$ and $S_2$ are materially reduced.

The process and apparatus of the present invention provide a means for fabricating a transistor such as shown in FIG. 3 having relatively large area junctions and, at the same time, having relatively low penetration of the alloying material into the semiconductor wafer for obtaining the favorable junction geometries shown in that figure.

An assembly jig constructed in accordance with the invention and suitable for use in the process of the invention is shown in FIGS. 4–6. As shown in the perspective disassembled view of FIG. 4, the jig includes a first block 20 of a heat resistant material such as graphite. Block 20 has a cutout section which forms a shoulder portion 21 and a shelf portion 22. A cavity 23 is formed in the shoulder portion 21 for receiving a disc of the material that is to be alloyed onto one of the faces of the semiconductor crystal to form the emitter electrode. The jig also includes a second block 24 of heat resistant material such as graphite, and block 24 is adapted to be fitted on shelf 22 and with a surface 25 facing the shoulder portion 21 of block 20. Surface 25 has a cavity 26 formed therein which is positioned to be aligned with cavity 23 when block 25 is fitted on the shelf portion 22 of block 20. Block 24 is secured to block 20 by a pair of screws 27 which may be composed of high heat resistant material such as graphite, the screws extending through apertures 28, 29 into threaded apertures 30, 31 in block 20.

To carry out the process of the invention, discs of the alloying material that are to form the emitter and collector electrodes are prepared. As previously stated, it is usual in present day units that such discs be composed of indium to be alloyed with an n-type germanium wafer. When indium is used, the discs may be formed by punching them from an indium sheet. The surfaces of the discs are usually cleaned in an etching solution of 70% nitric acid, 52% hydrofluoric acid and distilled water, in equal parts by volume. The emitter disc is then positioned in cavity 23 and the collector disc is positioned in cavity 26, as shown in FIG. 5.

The diameters of cavities 23 and 26 are selected so that the cavities have respective areas corresponding to the areas of the surface of the semiconductor wafers that are to be covered or wetted by the alloying material from the discs when the discs are heated to a molten condition. Moreover, the cavities have selected depths such that the tendency of the molten alloying material to assume the shape of a sphere is overcome and the molten alloying material is constrained to cover the entire areas of the wafer defined by the cavities. The diameters of the cavities are such that the areas of the cavities covered by the molten alloying material are relatively large so that relatively large area junctions may be formed within the crystal material.

The collector and emitter discs have diameters such that they fill the corresponding cavities and a selected thickness such that they protrude slightly from the cavities. This assures that the molten alloying metal will completely fill the cavities as is desirable if the full benefits of the invention are to be realized.

The semiconductor wafer is prepared in the usual manner, for example, a crystal of semiconductor such as germanium of a selected conductivity type is cut into relatively large wafers by means of a thin diamond or silicon wheel. The wafers are then lapped until each has a thickness of, for example, .014 inch. Each wafer is then diced into small surfaces with each of the smaller wafers comprising a semiconductor crystal that may be used in the process and apparatus of the invention. The dicing is usually accomplished by use of a multiple gang saw. The individual wafers are then etched to a thickness of about .008 inch in a nitric and hydrofluoric acid etching solution.

It is desirable that the crystal wafers be oriented and cut so that their faces are parallel to the Miller Indices (111) planes so as to obtain the type of junction geometry shown in FIG. 3, this being taught in copending application Serial No. 409,339 (*now Patent No. 2,971,869*) referred to previously herein.

One of the crystal wafers is placed edgewise on shelf portion 22 of block 20 against the shoulder portion 21, so that the disc of alloying material in cavity 23 is held against the side of the crystal. Block 24 is then fitted over shelf portion 22 so that its surface 25 engages the other side of the crystal with the disc of alloying material in cavity 26 being held against the crystal directly opposite the disc in cavity 23. Screws 27 are then inserted to hold the assembly together with the crystal 10 sandwiched between the blocks as shown in FIG. 5. The crystal wafer 10 is accurately located with respect to the cavities 23, 26 by shelf portion 22 at its bottom edge and by screws 27 at its sides (see FIG. 6). This enables the discs of alloying material to be precisely centered on the wafer in accurate alignment with one another. The collector electrode is usually smaller than the emitter, and cavity 26 and the discs therefor are made smaller than cavity 23 and the disc supported by the latter cavity.

The assembly is now placed in a furnace and fired at a controlled temperature of, for example, 550° C. in the case of germanium and indium. This temperature is sufficiently low so that excessive penetration of the alloying material into the crystal wafer is prevented in order to obtain the desired junction geometry such as shown in FIG. 3. This relatively low temperature normally is not sufficiently high for the proper amount of alloying material to wet and cover the areas required due to the surface tension causing the alloying material to assume a sphere. This tendency, as previously noted, is overcome in the present invention since the molten alloying material is constrained to cover the relatively large areas in the manner described above.

The following lists represent typical dimensions of assembly jigs used in carrying out the invention and of components of semiconductor units constructed thereby. These dimensions are listed herein merely by way of example and are not intended to limit the invention in any way:

| | | |
|---|---|---|
| Collector cavity | 0.125" diameter, 0.010" depth | ¼" x ½" x 0.008" Germanium. |
| Emitter cavity | 0.100" diameter, 0.010" depth | |
| Collector Indium | 0.125" diameter, 0.012" thick | |
| Emitter Indium | 0.100" diameter, 0.012" thick | |
| Collector cavity | 0.187" diameter, 0.007" depth | ⅜" x ½" x 0.008" Germanium. |
| Emitter cavity | 0.125" diameter, 0.007" depth | |
| Collector Indium | 0.190" diameter, 0.011" thick | |
| Emitter Indium | 0.128" diameter, 0.011" thick | |
| Collector cavity | 0.348" diameter, 0.013" depth | ½" x ½" x 0.008" Germanium. |
| Emitter cavity | 0.185" diameter, 0.007" depth | |
| Collector Indium | 0.348" diameter, 0.018" thick | |
| Emitter Indium | 0.185" diameter, 0.011" thick | |

The invention provides, therefore, an improved process and apparatus for the efficient production of high power alloyed-junction semiconductor units, whose junctions have relatively large areas for minimum current density and resulting low internal heating and low distortion.

I claim:

1. The method of forming a planar junction between an electrode and a semiconductor wafer having a face in a plane parallel with a Miller *Indices* (111) crystallographic plane, which comprises *providing a mold for receiving a semiconductor wafer therein and having an electrode-defining mold cavity bounded by a side wall surface and a plane surface both in a one-piece portion of said mold, said mold cavity corresponding in cross-sectional dimension to the ultimate desired cross-section of the electrode to be provided on the semiconductor wafer, and said cavity having a volume such that when a disc of impurity metal of appropriate volume is melted therein for alloying to such wafer the impurity metal fills the mold cavity at the face of the wafer against which the disc of impurity metal is positioned,* holding one face of *such* a disc of impurity metal against said face of the wafer with [a] *said* plane surface of [a] *the* mold *cavity* in engagement with the opposite face of the disc, heating the disc and the wafer *in the mold* to melt the disc *for alloying* while *it is* so held, *with the molten impurity metal of the disc filling the electrode-defining mold cavity at said wafer face and covering an area of the semiconductor wafer corresponding to the area of said cavity at said wafer face,* and cooling the disc and the wafer to solidify the disc while so holding the disc *in order to form an electrode on the wafer face and provide a planar junction within the wafer while the disc and wafer are maintained in the mold and the disc portion is in the mold cavity.*

2. The method of forming a planar junction between an electrode and a germanium wafer of n-type conductivity having a face in a plane parallel with a Miller *Indices* (111) crystallographic plane, which comprises *providing a mold for receiving a semiconductor wafer therein and having a mold cavity bounded by a side wall surface and a plane surface both in a one-piece portion of said mold, said mold cavity corresponding in cross-sectional dimension to the ultimate desired cross-section of the electrode to be provided on the semiconductor wafer, and said cavity having a volume such that when a disc of indium of appropriate volume is melted therein for alloying to such wafer the indium fills the mold cavity at the face of the wafer against which the disc of indium is positioned and is constrained by said plane surface of said mold cavity,* holding a face of a disc of indium against said face of the wafer with [a] *said* plane surface of [a] *the* mold *cavity,* heating the disc and the wafer *in the mold* to melt the disc *so that the molten disc fills the mold cavity at said face of the wafer and covers an area of the wafer defined by said mold cavity* while confining the *molten* disc with said plane surface of the mold to hold the face of the disc engaged thereby in a plane parallel with said face of the wafer, and cooling the disc and the wafer to solidify the disc *as an electrode on the wafer face and provide a planar junction within the wafer* while still confining the outer face of the disc to a plane parallel with said face of the wafer.

3. The method of providing a planar junction between the alloyed region of an electrode and the adjacent region of a semiconductor crystal to which the electrode is applied with the crystal having faces substantially parallel with Miller Indices (111) planes therein, which method comprises *providing a mold for receiving a semiconductor crystal therein and having an electrode-defining cavity bounded by a side wall surface and a plane surface both in a one-piece portion of said mold, said cavity corresponding in cross-sectional dimension to the ultimate desired cross-section of the electrode to be provided at the semiconductor crystal, and said cavity having a diameter and a depth such that when a preformed metal electrode disc is melted therein for alloying to the crystal the molten metal fills the cavity at the face of the crystal against which the preformed metal electrode disc is positioned and is constrained by said plane surface of said cavity,* maintaining one face of a preformed metal electrode disc against a face of the crystal by means of [a] *said* mold [which has a cavity therein] with [a] *said* plane surface *of the electrode-defining cavity therein* [which is] in engagement with the opposite face of the disc *and with a side wall of the electrode-defining cavity located at the circumferential edge of the disc,* heating the disc and *the* crystal in the mold *to melt the disc* while maintaining the aforesaid position thereof *within the cavity so that the molten disc fills the electrode-defining cavity at said wafer face and is constrained thereby to cover an area of the crystal defined by said cavity,* and cooling the mold with the disc and *the* crystal therein to provide an essentially flat surface on the disc on the outside thereof and a planar junction within the crystal substantially parallel to the (111) planes in the crystal.

4. The method of forming a planar junction between an electrode and a germanium wafer of n-type conductivity having a face in a plane substantially parallel with a Miller Indices (111) plane, which comprises *providing a mold for receiving a semiconductor wafer therein and having a walled cavity bounded by a side wall surface*

*and a plane surface in a one-piece portion of said mold, said walled cavity corresponding in cross-sectional dimension to the ultimate desired cross-section of the electrode to be provided at the semiconductor wafer, and said walled cavity having a diameter and a depth such that when a disc of indium of appropriate volume is melted therein for alloying to the wafer it fills the walled cavity at the face of the wafer against which the disc of indium is positioned and is constrained by said fixed plane surface of said walled cavity,* holding one face of *such* a disc of indium against said face of the wafer and having [a] *said* plane surface of [a] *the* walled cavity mold in engagement with the opposite face of the disc, heating the disc and the wafer to melt the disc while confining the disc *laterally* within the walled cavity *so that the molten disc covers an area of the wafer defined by said walled cavity* and *while further confining said disc* by said plane surface of the mold to hold the face of the disc engaged by the plane surface in a plane substantially parallel with said face of the wafer, and cooling the disc and the water to solidify the disc while still confining the outer face of the disc to a plane parallel with said face of the wafer and confining the outer boundary of the disc to the walled cavity of the mold.

References Cited in the file of this patent or the original patent

UNITED STATES PATENTS

| | | |
|---|---|---|
| 2,364,689 | Brooks | Dec. 12, 1944 |
| 2,560,792 | Gibney | July 17, 1951 |
| 2,697,052 | Dacey et al. | Dec. 14, 1954 |
| 2,699,133 | Ames et al. | Jan. 11, 1955 |
| 2,791,524 | Ozarow | May 7, 1957 |
| 2,937,960 | Pankove | May 24, 1960 |
| 2,962,396 | Pankove | Nov. 29, 1960 |
| 2,971,869 | Taylor | Feb. 14, 1961 |

FOREIGN PATENTS

| | | |
|---|---|---|
| 1,088,286 | France | Sept. 8, 1954 |

OTHER REFERENCES

Proceedings of the Institute of Radio Engineers, No. 11, vol. 40, November 1952, pages 1341 and 1342.